(12) United States Patent
Gordon et al.

(10) Patent No.: US 8,742,262 B2
(45) Date of Patent: Jun. 3, 2014

(54) LOW TEMPERATURE CO-FIRED CERAMIC STRUCTURE FOR HIGH FREQUENCY APPLICATIONS AND PROCESS FOR MAKING SAME

(75) Inventors: Scott E. Gordon, Cary, NC (US); Elizabeth D. Hughes, Raleigh, NC (US); Joao Carlos Malerbi, Westfield, IN (US); Deepukumar M. Nair, Cary, NC (US); Kumaran Manikantan Nair, Head of the Harbor, NY (US); James M. Parisi, Stem, NC (US); Michael Arnett Smith, Wake Forest, NC (US); Ken E. Souders, Apex, NC (US)

(73) Assignee: E I du Pont de Nemours and Company, Wilmington, DE (US)

( * ) Notice: Subject to any disclaimer, the term of this patent is extended or adjusted under 35 U.S.C. 154(b) by 258 days.

(21) Appl. No.: 13/483,837

(22) Filed: May 30, 2012

(65) Prior Publication Data
US 2012/0305296 A1 Dec. 6, 2012

Related U.S. Application Data

(60) Provisional application No. 61/492,024, filed on Jun. 1, 2011.

(51) Int. Cl.
| H05K 1/09 | (2006.01) |
| H05K 1/00 | (2006.01) |
| H05K 1/03 | (2006.01) |
| H05K 3/02 | (2006.01) |
| B05D 5/12 | (2006.01) |

(52) U.S. Cl.
USPC .......... 174/257; 174/255; 174/264; 427/125; 427/126.2; 29/846

(58) Field of Classification Search
USPC .......... 174/250, 255–258, 262, 264; 427/126, 427/126.2; 29/830, 831, 846
See application file for complete search history.

(56) References Cited

U.S. PATENT DOCUMENTS

| 4,721,831 A | 1/1988 | Vora |
| 6,621,682 B1 | 9/2003 | Takakuwa et al. |
| 6,678,144 B2 * | 1/2004 | Higashi et al. ............. 361/306.3 |

(Continued)

FOREIGN PATENT DOCUMENTS

| EP | 0 016 306 A1 | 10/1980 |
| EP | 0 073 149 A2 | 3/1983 |
| EP | 0 587 382 A2 | 3/1994 |

OTHER PUBLICATIONS

Ceramic Circuit board having thin film conductor patterns—is ceramic matrix having sides of specified surface roughness perforated with metal connecting conductors, DERWENT, Apr. 7, 1989, XP002398016, the whole document & JP 2 267989 A (NGK Insulators Ltd) Nov. 1, 1990 abstract.

*Primary Examiner* — Hoa C Nguyen

(57) ABSTRACT

Disclosed herein is a multilayer low temperature co-fired ceramic (LTCC) structure comprising a multilayer low temperature co-fired ceramic comprising glass-ceramic dielectric layers with screen printed thick film inner conductors on portions of the layers and with thin film outer conductors deposited on the upper and lower outer surfaces of the LTCC. At least a portion of the thin film outer conductors is patterned in the form of lines and the spacings between the lines are less then 50 μm. Also disclosed is a process for making the LTCC structure.

24 Claims, 3 Drawing Sheets

(56) References Cited

U.S. PATENT DOCUMENTS

| | | |
|---|---|---|
| 7,415,761 B2 * | 8/2008 | Hirose et al. .................... 29/852 |
| 8,069,560 B2 * | 12/2011 | Mori et al. ...................... 29/852 |
| 2003/0110629 A1 | 6/2003 | Horng et al. |
| 2004/0016570 A1 | 1/2004 | Yamamoto et al. |
| 2009/0229860 A1 | 9/2009 | Shin et al. |
| 2010/0086807 A1 | 4/2010 | Nair et al. |
| 2010/0195954 A1 * | 8/2010 | Asai et al. ........................ 385/14 |
| 2010/0282502 A1 * | 11/2010 | Kato ............................. 174/260 |
| 2011/0035939 A1 * | 2/2011 | Mori et al. ...................... 29/852 |

\* cited by examiner

LOW TEMPERATURE CO-FIRED CERAMIC STRUCTURE FOR HIGH FREQUENCY APPLICATIONS AND PROCESS FOR MAKING SAME

FIELD OF THE INVENTION

This invention is directed to a low temperature co-fired ceramic (LTCC) structure comprising both thick film and thin film conductors and a process for making the structure.

TECHNICAL BACKGROUND OF THE INVENTION

Low temperature co-fired ceramic (LTCC) structures are well-known and provide a potential for high density, high reliability, high performance and low cost interconnect packages. The LTCC structure is comprised of low loss, co-fireable glass-ceramic dielectric tape and compatible co-fireable thick film conductive compositions that are typically screen printed directly onto the individual green sheet layers. Embedded devices such as resistors, capacitors and inductors may be applied to the individual green sheets. Vias are formed in each layer and filled to provide electrical connections between the individual layers and the layers and the outer surfaces of the LTCC. The individual layers are laminated and then fired to produce a LTCC. Thick film conductive compositions can be screen printed onto the outer surfaces of the co-fired LTCC and then fired. Multilayer LTCC processing, including thick film compositions printing on Green tapes, lamination methods and high temperature firing processes are further described in U.S. Pat. No. 7,687,417 and U.S. Pat. No. 7,611,645.

A representative cross-section of a LTCC structure with thick film conductive compositions screen printed onto the outer surfaces is shown in FIG. 1. The LTCC structure 10 contains glass-ceramic dielectric layers 11 and screen printed thick film inner conductors 12. Thick film via interconnects 13 provide electrical connections between the inner conductors 12 and thick film via interconnects 14 provide electrical connections between the inner conductors 12 and the thick film outer conductor 15 on the upper surface 16 of the LTCC and the thick film outer conductor 17 on the lower surface 18 of the LTCC.

The screen printed thick film outer conductors have the disadvantage of limited spatial resolution.

There is a need for outer conductors with narrow conductor line widths and dose spacing between conductor lines for use in microwave and millimeter wave frequency applications.

SUMMARY OF THE INVENTION

The present invention relates to a multilayer low temperature co-fired ceramic structure comprising:
a) a multilayer low temperature co-fired ceramic comprising glass-ceramic dielectric layers with screen printed thick film inner conductors on portions of the layers and with screen printed thick film via interconnects between the inner conductors and from the inner conductors to the upper and lower outer surfaces of the low temperature co-fired ceramic, wherein the upper and lower outer surfaces of the low temperature co-fired ceramic have been polished subsequent to firing; and
b) thin film outer conductors deposited on the polished upper and lower outer surfaces of the low temperature co-fired ceramic, wherein the thin film outer conductors are patterned such that at least a portion of the thin film outer conductors is in the form of lines and wherein the spacings between the lines are less then 50 µm;
the thick film inner conductors and the thick film via interconnects between the inner conductors, the thin film outer conductors, and the thick film via interconnects from the inner conductors to the upper and lower outer surfaces all comprising precious metals selected independently from a group consisting of gold, silver, platinum, palladium, mixtures thereof and alloys thereof and wherein the thick film via interconnects from the inner conductors to the upper and lower outer surfaces provide electrical connections to the thin film outer conductors.

The present invention also relates to a multilayer low temperature co-fired ceramic structure comprising:
a) a multilayer low temperature co-fired ceramic comprising glass-ceramic dielectric layers with screen printed thick film inner conductors on portions of the layers and with screen printed thick film via interconnects between the inner conductors and from the inner conductors to one outer surface of the low temperature co-fired ceramic, wherein said one outer surface of the low temperature co-fired ceramic has been polished subsequent to firing; and
b) a thin film outer conductor deposited on said one polished outer surface of the low temperature co-fired ceramic, wherein the thin film outer conductor is patterned such that at least a portion of the thin film outer conductor is in the form of lines and wherein the spacings between the lines are less then 50 µm;
the thick film inner conductors and the thick film via interconnects between the inner conductors, the thin film outer conductor, and the thick film via interconnects from the inner conductors to said one outer surface all comprising precious metals independently selected from a group consisting of gold, silver, platinum, palladium, mixtures thereof and alloys thereof and wherein the thick film via interconnects from the inner conductors to said one outer surface provides electrical connections to the thin film outer conductor.

Also provided is a process for producing a multilayer low temperature co-fired ceramic structure, the process comprising:
a) providing a multilayer low temperature co-fired ceramic comprising glass-ceramic dielectric layers with screen printed thick film inner conductors on portions of the layers and with screen printed thick film via interconnects between the inner conductors and from the inner conductors to the upper and lower outer surfaces of the low temperature co-fired ceramic;
b) polishing the upper and lower outer surfaces; and
c) vacuum depositing thin film outer conductors on the polished upper and lower outer surfaces of the low temperature co-fired ceramic; and
d) patterning the thin film outer conductors such that at least a portion of the thin film outer conductors is in the form of lines, wherein the spacings between the lines are less then 50 µm;
the thick film inner conductors and the thick film via interconnects between the inner conductors, the thin film outer conductors, and the thick film via interconnects from the inner conductors to the upper and lower outer surfaces all comprising precious metals selected independently from a group consisting of gold, silver, platinum, palladium, mixtures thereof and alloys thereof and wherein the thick film via interconnects from the inner conductors to the upper and lower surfaces provide electrical connections to the thin film outer conductors.

Further provided is a process for producing a multilayer low temperature co-fired ceramic structure, the process comprising:
a) providing a multilayer low temperature co-fired ceramic comprising glass-ceramic dielectric layers with screen printed thick film inner conductors on portions of the layers and with screen printed thick film via interconnects between the inner conductors and from the inner conductors to said one outer surface of the low temperature co-fired ceramic;
b) polishing said one outer surface;
c) vacuum depositing a thin film outer conductor on said one polished outer surface of the low temperature co-fired ceramic; and
d) patterning the thin film outer conductor such that at least a portion of the thin film outer conductor is in the form of lines, wherein the spacings between the lines are less then 50 μm;
the thick film inner conductors and the thick film via interconnects between the inner conductors, the thin film outer conductor, and the thick film via interconnects from the inner conductors to said one outer surface all comprising precious metals independently selected from a group consisting of gold, silver, platinum, palladium, mixtures thereof and alloys thereof and wherein the thick film via interconnects from the inner conductors to said one outer surface provides electrical connections to the thin film outer conductor.

DETAILED DESCRIPTION OF THE INVENTION

Figure 1:
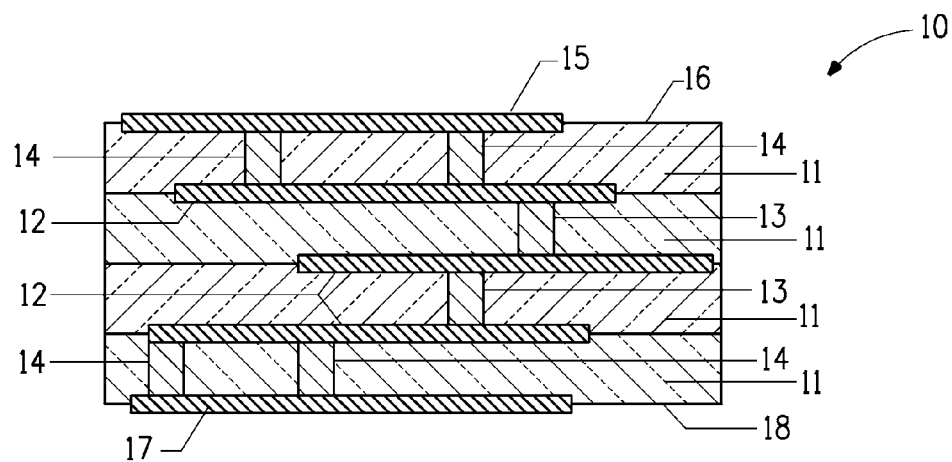
FIG. 1 is a representative cross-section of a LTCC structure with thick film conductor screen printed onto the inner and outer surfaces.
Figure 2:
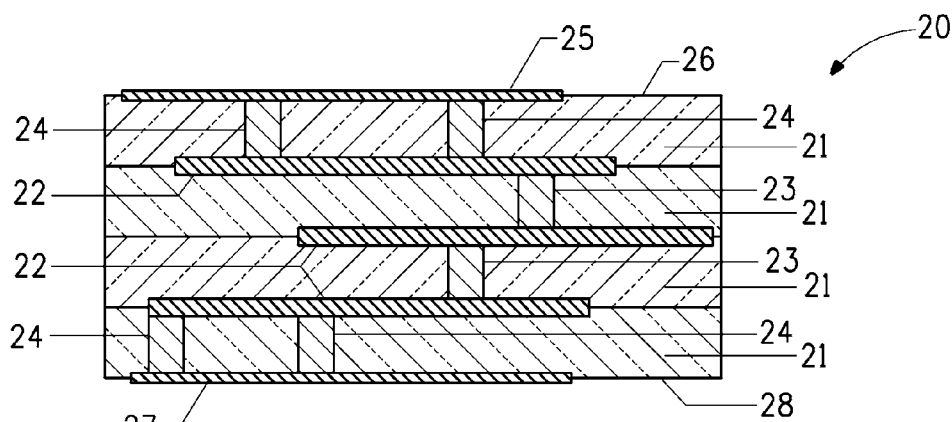
FIG. 2 is a representative cross-section of a LTCC structure of the invention with a thin film conductor deposited onto the outer surfaces and thick film conductor screen printed onto the inner surfaces.

One embodiment of the instant multilayer low temperature co-fired ceramic structure with thin film conductors deposited on the polished surfaces of the LTCC is shown in FIG. 2. This thin film/thick film LTCC structure 20 is comprised of a multilayer low temperature co-fired ceramic comprising glass-ceramic dielectric layers 21 with screen printed thick film inner conductors 22 on portions of the layers 21 and thin film outer conductors 25 and 27 deposited on the polished upper 26 and lower 28 outer surfaces, respectively, of the LTCC. Screen printed thick film via interconnects 23 between the inner conductors 22 provide electrical connections between the inner conductors 22. Screen printed thick film via interconnects 24 from the inner conductors 22 to the upper 26 and lower 28 outer surfaces of the LTCC provide electrical connections between the inner conductors 22 and the thin film outer conductors 25 and 27. It is understood that the location of the portions of the layers 21 containing screen printed thick film inner conductors 22, the locations of the thin film outer conductors 25 and 27, and the locations of the vias 23 and 24 are all in accordance with the requirements of the particular circuit design. The thin film outer conductors 25 and 27 are patterned such that at least a portion of the thin film outer conductors 25 and 27 is in the form of lines. The spacings between the lines are less then 50 μm.

The thick film inner conductors 22 and the thick film via interconnects 23, the tin film outer conductors 25 and 27, and the thick film via interconnects 24 to the upper and lower surfaces are all comprised of precious metals selected independently from a group consisting of gold, silver, platinum, palladium, mixtures thereof and alloys thereof. Therefore these various conductors can be comprised of different precious metals or the same precious metal. In an embodiment, the thick film inner conductors 22 and the thick film via interconnects 23 are silver, the thin film outer conductors 25 and 27 are gold, and the thick film via interconnects 24 to the upper and lower surfaces are a mixture of silver and gold. In one such embodiment, these interconnects can be 20-100 wt % gold and 0-80 wt % silver. In still another embodiment, the thick film inner conductors 22 and the thick film via interconnects 23, the thin film outer conductors 25 and 27, and the thick film via interconnects 24 to the upper and lower surfaces are all gold.

Gold outer conductors have considerable advantages over silver outer conductors. For example, if the outer conductor is an antenna that needs to be directly exposed to the environment for proper functioning, the gold is corrosion resistant while the silver will corrode and lose its effectiveness. In addition soldering and wire-bonding are more readily accomplished with gold.

The process for preparing the instant multilayer low temperature co-fired ceramic structure shown in FIG. 2 begins by providing a multilayer LTCC comprising glass-ceramic dielectric layers 21 with screen printed thick film inner conductors 22 on portions of the layers 21 and screen printed thick film via interconnects 23 between the inner conductors 22 and screen printed thick film via interconnects 24 from the inner conductors 22 to the upper 26 and lower 28 outer surfaces of the LTCC. The upper 26 and lower 28 outer surfaces of the LTCC are then polished to provide sufficiently smooth surfaces to enable vacuum deposition of the thin film outer conductors 25 and 27 on the upper 26 and lower 28 outer surfaces, respectively, of the LTCC.

In another embodiment of the instant multilayer low temperature co-fired ceramic structure there are thin film outer conductors on only one outer surface of the LTCC. For such an embodiment, only one outer surface of the LTCC needs to be polished and screen printed thick film via interconnects from the inner conductors are only needed to that one outer surface of the LTCC.

The LTCC is fired before depositing the thin film outer conductors.

Surfaces of fired LTCC substrates show non-uniform smoothness with varying surface roughness. Polishing is used as a technique to get a more uniform surface smoothness to deposit the thin film conductor composition. Rough LTCC surface morphology will not result in uniform thin film conductor ones after deposition.

The thin film outer conductor patterns can be formed on the polished surfaces by any of the standard thin film processes. One such technique employs a blanket coating of thin film metal on the substrate using vacuum deposition. Once this step is completed the conductor can be patterned using chemical etching alone or in combination with laser ablation. LTCC material systems described here are compatible to laser processing without causing any damage to the circuits.

There are various compositions available for use as the glass-ceramic dielectric layers of the LTCC. Preferred is DuPont™ GreenTape™ 9K7 (Available from DuPont Company, Wilmington, Del.). It polishes easily and provides good adhesion to thin film metallization.

The thick film inner conductors, i.e., the conductors screen printed on portions of the various individual layers, and the screen printed via interconnects between the inner conductors can be screen printed using conventional thick film screen printers. The conductor pastes used for the inner conductors can be formulated to be compatible with the shrinkage of the GreenTape™. The via interconnect paste is specially formulated to fill the vias hole and to be shrinkage matched to the GreenTape™. Typically these pastes are compositions compromising precious metal powders, inorganic bonding agents, sintering aids and sintering inhibitors, if needed in well dispersed organic medium. Typical conductors used are commercially available DuPont LTCC conductor systems (Product data sheets available from DuPont Company, Wilmington, Del.) which includes LL601, silver via-fill conductor; LL612, silver signal line conductor; LL601, silver ground plane conductor; LL500 gold via-fill conductor; LL507, gold signal line conductor; LL505, gold ground plane conductor and transition via-fill silver-gold conductor described in U.S. patent application Ser. No. 12/981,196.

The thin film outer conductors are deposited onto the polished outer surfaces of the LTCCs. In one embodiment these conductors are vacuum deposited. The use of thin film outer conductors enables the production of lines with spacings between the lines of less then 50 μm. In some embodiments, the spacings between the lines are less then 10 μm and can be as low as 1-2 μm.

EXAMPLES

Example 1

To demonstrate a typical application of the instant invention with a thin film conductor deposited onto an outer surface of a LTCC, a coplanar waveguide (CPW) interconnect transmission line was fabricated and tested on a 9K7 LTCC material system.

Four dielectric layers were used for the test circuit. Screen printed thick film gold metallization (LL 505, gold paste, available from DuPont Co., Wilmington, Del.) was used to form the thick film inner conductors of the circuit. Screen printed via interconnects (LL500, gold via fill paste, available from DuPont Co., Wilmington, Del.) were formed to connect the inner conductors to one another and to connect the inner conductors to the thin film conductor to be deposited on the upper outer surface of the LTCC. The LTCC substrate with the thick film inner conductors and via interconnects was fired under a suitable temperature profile to form a monolithic ceramic circuit. The fired LTCC substrate was subjected to lapping of the top and bottom surfaces followed by a polishing step. These steps are necessary to obtain the level of smoothness required for vacuum deposition of the thin gold film which is used for the outer conductor. The lapping was done with a mechanical grinder with a mineral oil medium. The polishing step made use of diamond tools to obtain a very smooth surface on the fired LTCC.

Surface roughness of LTCC polished and unpolished fired substrates was measured using a Tencor AS-500 stylus surface profiler. Ten random 20 mm scans were performed for each substrate. The data points in Table I are the average of the absolute values of the deviations from the mean over the length of each 20 mm scan. The average for the ten scans and the standard deviation (St Dev) are shown. All values are in nm.

TABLE I

|  | Polished 9K7 | Unpolished 9K7 |
|---|---|---|
|  | 73.6 | 494.9 |
|  | 75.7 | 468.7 |
|  | 75.3 | 464.4 |
|  | 70.1 | 520.3 |
|  | 72.5 | 500.8 |
|  | 82.8 | 535.6 |
|  | 82.1 | 494.8 |
|  | 70.7 | 466.4 |
|  | 85.4 | 524.4 |
|  | 77.2 | 485.7 |
| Average | 76.5 | 495.6 |
| St Dev | 5.3 | 25.2 |

Figure 3:
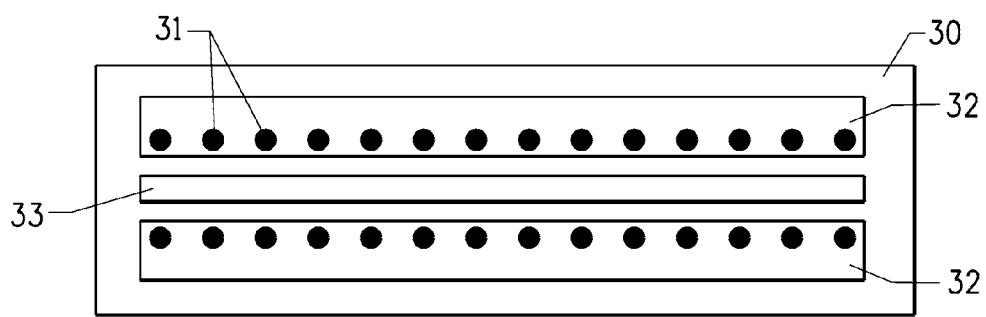
FIG. 3 is a schematic diagram of the coplanar waveguide that was fabricated in Example 1.

A 50 Ohm thin film co-planar waveguide transmission line of the form shown in FIG. 3 was then prepared by chemical etching of a vacuum deposited blanket metal stack of titanium-tungsten-gold on the polished LTCC substrate 30. The screen printed via interconnects 31 are shown connected to the thin film gold groundplanes 32. The signal conductor 33 is shown between the groundplanes. This is a thin film/thick film LTCC structure of the invention.

A typical thin film CPW with the same design shown in FIG. 3 was prepared by chemical etching of a vacuum deposited blanket metal stack of titanium-tungsten-gold to compare its performance with the thin film/thick film LTCC structure of the invention. The two CPW interconnect transmission lines were characterized for transmission performance by measuring its scattering parameters (S-parameters) using a Vector Network Analyzer (VNA) in the frequency range of 10 MHz to 65 GHz. The results of S parameter testing for both type of circuits are shown in FIGS. 4 and 5

Figure 4:
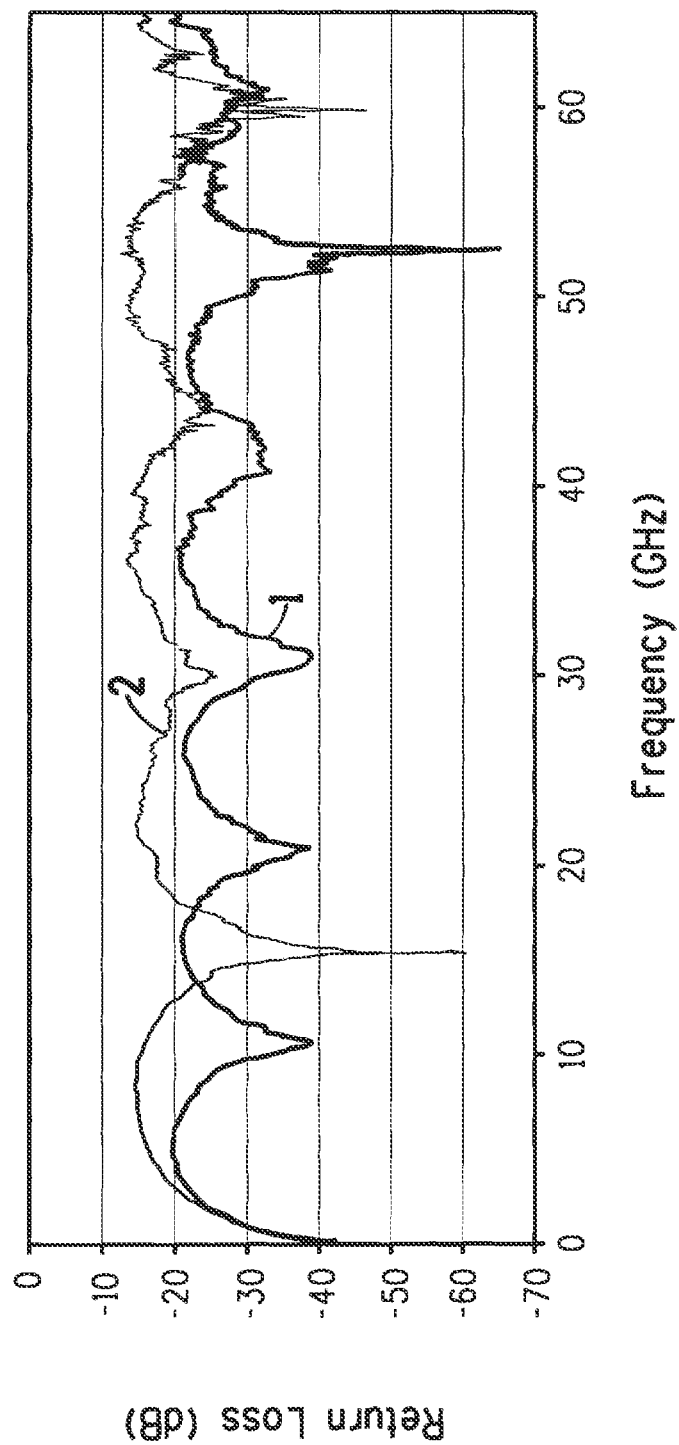
FIG. 4 shows the return loss for the coplanar waveguide (CPW) thin film/thick film LTCC structure of Example 1 and for the comparison thin film CPW.

FIG. 4 shows the return loss for the CPW thin film/thick film LTCC structure of the invention 1 and for the comparison thin film CPW 2. The return loss measurements shows nearly 5 to 10 dB improvement in performance of the thin film/thick film CPW compared to that of the thin film CPW of the same design.

Figure 5:
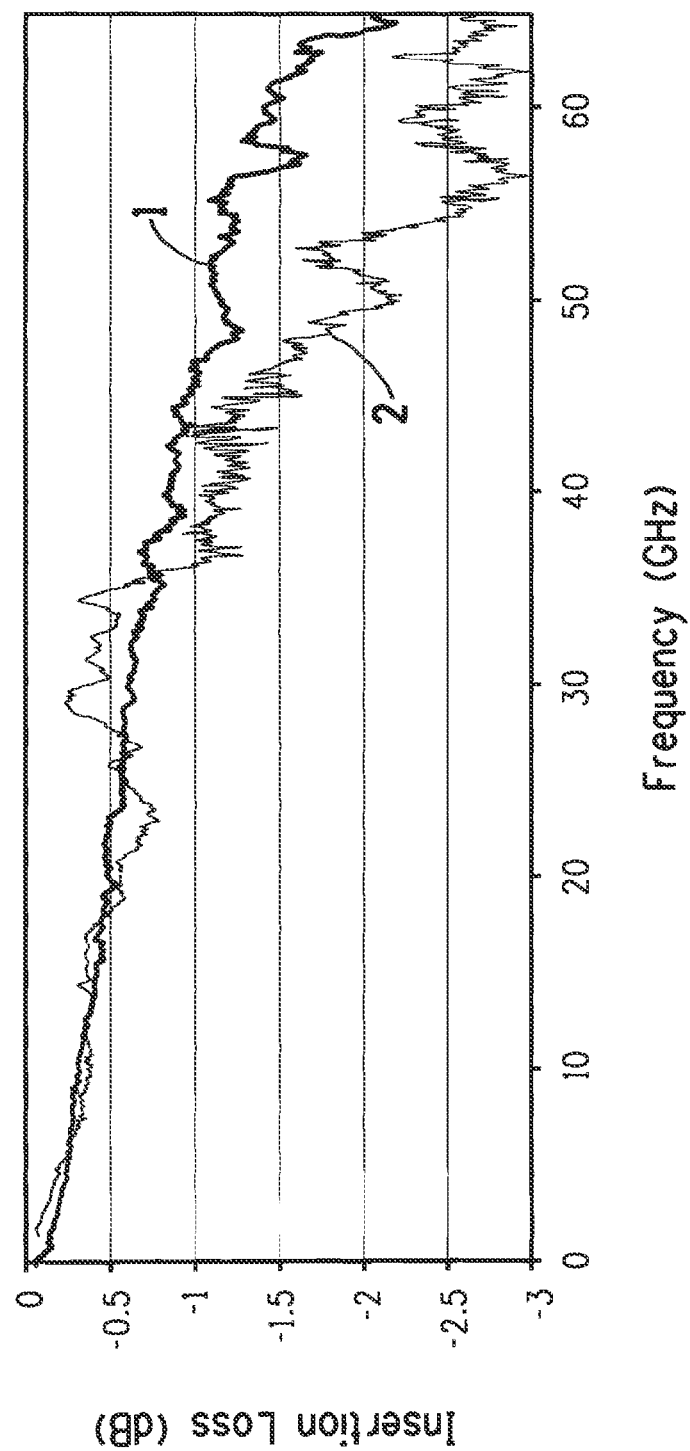
FIG. 5 shows the insertion loss for the CPW thin film/thick film LTCC structure of Example 1 and for the comparison thin film CPW.

FIG. 5 shows the insertion loss for the CPW thin film/thick film LTCC structure of the invention 1 and for the comparison thin film CPW 2.

The insertion loss measurements indicates a significantly better performance for the thin film/thick film CPW compared to the thin film CPW of the same design. The improvement in insertion loss gets significantly better at frequencies above 35 GHz and the trend in the data indicates this continues beyond the upper limit of the test frequency, i.e., 65 GHz.

Example 2

A thin film conductor deposited onto an outer surface of a LTCC could be demonstrated using mixed gold-silver conductors rather than the all gold conductors of Example 1. In this case, a silver thick film conductor (LL602, silver paste, available from DuPont Co., Wilmington, Del.) can be used as in place of the gold thick film internal conductors of Example 1. A silver thick film via fill (LL601, silver paste, available from DuPont Co., Wilmington, Del.) can be used for vertical interconnections between the inner silver conductors. A silver-gold thick film metallization ((LL701, silver-gold paste, available from DuPont Co., Wilmington, Del.) can be used to provide reliable, void free connections between the inner silver conductors and the outer gold thin film conductor.

What is claimed is:

1. A multilayer low temperature co-fired ceramic structure comprising:
   a) a multilayer low temperature co-fired ceramic comprising glass-ceramic dielectric layers with screen printed thick film inner conductors on portions of said layers and with screen printed thick film via interconnects between said inner conductors and from said inner conductors to the upper and lower outer surfaces of said low temperature co-fired ceramic, wherein the upper and lower outer surfaces of said low temperature co-fired ceramic have been polished subsequent to firing; and
   b) thin film outer conductors deposited on said polished upper and lower outer surfaces of said low temperature co-fired ceramic, wherein said thin film outer conductors are patterned such that at least a portion of said thin film outer conductors is in the form of lines and wherein the spacings between said lines are less then 50 μm;

said thick film inner conductors and said thick film via interconnects between said inner conductors, said thin film outer conductors, and said thick film via interconnects from said inner conductors to said upper and lower outer surfaces all comprising precious metals independently selected from a group consisting of gold, silver, platinum, palladium, mixtures thereof and alloys thereof and wherein said thick film via interconnects from said inner conductors to said upper and lower outer surfaces provide electrical connections to said thin film outer conductors.

2. The multilayer low temperature co-fired ceramic structure of claim 1, wherein said spacings between said lines are less then 10 μm.

3. The multilayer low temperature co-fired ceramic structure of claim 2, wherein said spacings between said lines are 1-2 μm.

4. The multilayer low temperature co-fired ceramic structure of claim 1, wherein said thick film inner conductors and said thick film via interconnects between said inner conductors are silver, wherein said thin film outer conductors are gold, and wherein said thick film via interconnects from said inner conductors to said upper and lower surfaces are a mixture of silver and gold.

5. The multilayer low temperature co-fired ceramic structure of claim 1, wherein said thick film inner conductors and said thick film via interconnects between said inner conductors are silver, wherein said thin film outer conductors are gold, and wherein said thick film via interconnects from said inner conductors to said upper and lower surfaces are 20-100 wt % gold and 0-80 wt % silver.

6. The multilayer low temperature co-fired ceramic structure of claim 1, wherein said thick film inner conductors and said thick film via interconnects between said inner conductors, said thin film outer conductors, and said thick film via interconnects from said inner conductors to said upper and lower surfaces are all gold.

7. A multilayer low temperature co-fired ceramic structure comprising:
   a) a multilayer low temperature co-fired ceramic comprising glass-ceramic dielectric layers with screen printed thick film inner conductors on portions of said layers and with screen printed thick film via interconnects between said inner conductors and from said inner conductors to one outer surface of said low temperature co-fired ceramic, wherein said one outer surface of said low temperature co-fired ceramic has been polished subsequent to firing; and
   b) a thin film outer conductor deposited on said polished one outer surface of said low temperature co-fired ceramic, wherein said thin film outer conductor is patterned such that at least a portion of said thin film outer conductor is in the form of lines and wherein the spacings between said lines are less then 50 μm;

said thick film inner conductors and said thick film via interconnects between said inner conductors, said thin film outer conductor, and said thick film via interconnects from said inner conductors to said one outer surface all comprising precious metals independently selected from a group consisting of gold, silver, platinum, palladium, mixtures thereof and alloys thereof and wherein said thick film via interconnects from said inner conductors to said one outer surface provides electrical connections to said thin film outer conductor.

8. The multilayer low temperature co-fired ceramic structure of claim 7, wherein said spacings between said lines are less then 10 μm.

9. The multilayer low temperature co-fired ceramic structure of claim 8, wherein said spacings between said lines are 1-2 μm.

10. The multilayer low temperature co-fired ceramic structure of claim 7, wherein said thick film inner conductors and said thick film via interconnects between said inner conductors are silver, wherein said thin film outer conductor is gold, and wherein said thick film via interconnects from said inner conductors to said one outer surface are a mixture of silver and gold.

11. The multilayer low temperature co-fired ceramic structure of claim 7, wherein said thick film inner conductors and said thick film via interconnects between said inner conductors are silver, wherein said thin film outer conductor is gold, and wherein said thick film via interconnects from said inner conductors to said one outer surface are 20-100 wt % gold and 0-80 wt % silver.

12. The multilayer low temperature co-fired ceramic structure of claim 7, wherein said thick film inner conductors and said thick film via interconnects between said inner conductors, said thin film outer conductors, and said thick film via interconnects from said inner conductors to said one outer surface are all gold.

13. A process for producing a multilayer low temperature co-fired ceramic structure, said process comprising:
   a) providing a multilayer low temperature co-fired ceramic comprising glass-ceramic dielectric layers with screen printed thick film inner conductors on portions of said layers and with screen printed thick film via interconnects between said inner conductors and from said inner conductors to the upper and lower outer surfaces of said low temperature co-fired ceramic;
   b) polishing said upper and lower outer surfaces;
   c) vacuum depositing thin film outer conductors on said polished upper and lower outer surfaces of said low temperature co-fired ceramic; and
   d) patterning said thin film outer conductors such that at east a portion of said thin film outer conductors is in the form of lines, wherein the spacings between said lines are less then 50 μm;

said thick film inner conductors and said thick film via interconnects between said inner conductors, said thin film outer conductors, and said thick film via interconnects from said inner conductors to said upper and lower outer surfaces all comprising precious metals independently selected from a group consisting of gold, silver, platinum, palladium, mixtures thereof and alloys thereof and wherein said thick film via interconnects from said inner conductors to said upper and lower outer surfaces provide electrical connections to said thin film outer conductors.

14. The process of claim 13, wherein said spacings between said lines are less then 10 μm.

15. The process of claim 14, wherein said spacings between said lines are 1-2 μm.

16. The process of claim 13, wherein said thick film inner conductors and said thick film via interconnects between said inner conductors are silver, wherein said thin film outer conductors are gold, and wherein said thick film via interconnects from said inner conductors to said upper and lower surfaces are a mixture of silver and gold.

17. The process of claim 13, wherein said thick film inner conductors and said thick film via interconnects between said inner conductors are silver, wherein said thin film outer conductors are gold, and wherein said thick film via interconnects from said inner conductors to said upper and lower surfaces are 20-100 wt % gold and 0-80 wt % silver.

18. The process of claim 13, wherein said thick film inner conductors and said thick film via interconnects between said inner conductors, said thin film outer conductors, and said thick film via interconnects from said inner conductors to said upper and lower surfaces are all gold.

19. A process for producing a multilayer low temperature co-fired ceramic structure, said process comprising:
  a) providing a multilayer low temperature co-fired ceramic comprising glass-ceramic dielectric layers with screen printed thick film inner conductors on portions of said layers and with screen printed thick film via interconnects between said inner conductors and from said inner conductors to one outer surface of said low temperature co-fired ceramic;
  b) polishing said one outer surface;
  c) vacuum depositing a thin film outer conductor on said one polished outer surface of said low temperature co-fired ceramic; and
  d) patterning said thin film outer conductor such that at least a portion of said thin film outer conductor is in the form of lines, wherein the spacings between said lines are less then 50 μm;

said thick film inner conductors and said thick film via interconnects between said inner conductors, said thin film outer conductor, and said thick film via interconnects from said inner conductors to said one outer surface all comprising precious metals independently selected from a group consisting of gold, silver, platinum, palladium, mixtures thereof and alloys thereof and wherein said thick film via interconnects from said inner conductors to said one outer surface provides electrical connections to said thin film outer conductor.

20. The process of claim 19, wherein said spacings between said lines are less then 10 μm.

21. The process of claim 20, wherein said spacings between said lines are 1-2 μm.

22. The process of claim 19, wherein said thick film inner conductors and said thick film via interconnects between said inner conductors are silver, wherein said thin film outer conductor is gold, and wherein said thick film via interconnects from said inner conductors to said one outer surface are a mixture of silver and gold.

23. The process of claim 19, wherein said thick film inner conductors and said thick film via interconnects between said inner conductors are silver, wherein said thin film outer conductor is gold, and wherein said thick film via interconnects from said inner conductors to said one outer surface are 20-80 wt % gold and 0-80 wt % silver.

24. The process of claim 19, wherein said thick film inner conductors and said thick film via interconnects between said inner conductors, said thin film outer conductors, and said thick film via interconnects from said inner conductors to said one outer surface are all gold.

* * * * *

UNITED STATES PATENT AND TRADEMARK OFFICE
CERTIFICATE OF CORRECTION

| | | |
|---|---|---|
| PATENT NO. | : 8,742,262 B2 | Page 1 of 1 |
| APPLICATION NO. | : 13/483837 | |
| DATED | : June 3, 2014 | |
| INVENTOR(S) | : Scott E Gordon et al. | |

It is certified that error appears in the above-identified patent and that said Letters Patent is hereby corrected as shown below:

In the Specification

Column 4, Line 59 – please replace "ones" with -- lines --.

In the Claims

Column 8, Claim 13, Line 57 – please replace "east" with -- least --.

Signed and Sealed this
Twelfth Day of August, 2014

Michelle K. Lee
*Deputy Director of the United States Patent and Trademark Office*